United States Patent
Jiang et al.

(10) Patent No.: US 7,356,794 B2
(45) Date of Patent: Apr. 8, 2008

(54) SYSTEM AND METHOD FOR DESIGNING A DELAYER EMULATION MODEL

(75) Inventors: Wu Jiang, Shenzhen (CN); Yun Li, Shenzhen (CN)

(73) Assignees: Hong Fu Jin Precision Industry (Shenzhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 184 days.

(21) Appl. No.: 11/285,661

(22) Filed: Nov. 21, 2005

(65) Prior Publication Data

US 2006/0112358 A1 May 25, 2006

(30) Foreign Application Priority Data

Nov. 19, 2004  (TW) ............... 93135565 A

(51) Int. Cl.
*G06F 17/50* (2006.01)
(52) U.S. Cl. ............................... 716/6; 716/1
(58) Field of Classification Search ............ 716/1, 716/2, 6
See application file for complete search history.

(56) References Cited

U.S. PATENT DOCUMENTS 5,268,894 A  12/1993  Ogawa et al.
2002/0147605 A1*  10/2002  Southworth et al. ........... 705/1

* cited by examiner

*Primary Examiner*—Thuan Do
(74) *Attorney, Agent, or Firm*—Morris Manning Martin LLP; Tim Tingkang Xia, Esq.

(57) ABSTRACT

A system for designing a delayer emulation model (1) includes a delayer emulation model generating apparatus (2). The delay emulation model generating apparatus includes: a delay circuit defining module (20) for defining delay parameters of a delay circuit, and generating the delay circuit; a delay signal setting module (21) for setting a delay interval for the transition from a high voltage to a low voltage and a delay interval for the transition from a low voltage to a high voltage of an input delay signal; a voltage regulation circuit defining module (22) for defining voltage parameters of a voltage regulation circuit, and generating the voltage regulation circuit; a voltage regulating module (23) for regulating a voltage of the input delay signal from the delay circuit according to requirements of an output delay signal; and a model calling module (24) for generating the delayer emulation model by means of calling the delay circuit and the voltage regulation circuit.

10 Claims, 3 Drawing Sheets

SYSTEM AND METHOD FOR DESIGNING A DELAYER EMULATION MODEL

BACKGROUND OF THE INVENTION

1. Field of the Invention

The present invention relates to systems and methods for designing a delayer model, and more particularly to a system and method for designing a delayer emulation model.

2. General Background

Delay circuits have been widely used in the process of designing printed circuit boards of electronic instruments. For example, a motherboard may include various kinds of delay circuits, such as controller delay circuits, or driver delay circuits. However, in recent years, designers find that present delayers are not powerful enough to meet requirements of designing some electronic instruments. For example, the present delayers cannot set delay intervals for the transition from a high voltage to a low voltage and transition from a low voltage to a high voltage of a delay signal. Further, voltage of an input delay signal cannot be regulated by the present delayers.

What is needed, therefore, is a system for designing a delayer emulation model, which can set delay intervals of an input delay signal according to delay requirements, and regulating a voltage of the input delay signal.

Similarly, what is also needed is a method for designing a delayer emulation model, which can set delay intervals of an input delay signal according to delay requirements, and regulating a voltage of the input delay signal.

SUMMARY

A system for designing a delayer emulation model in accordance with a preferred embodiment includes a delayer emulation model generating apparatus. The delayer emulation model includes a delay circuit and a voltage regulation circuit. The delay circuit includes a digital buffer for setting delay intervals of an input delay signal according to delay requirements. The voltage regulation circuit includes a voltage amplifier for regulating (amplifying/falling) voltage of the delay signal from the delay circuit.

The delayer emulation model generating apparatus includes a delay circuit defining module, a delay signal setting module, a voltage regulation circuit defining module, a voltage regulating module, and a model calling module. The delay circuit model defining module is used for defining a delay circuit defining module for defining delay parameters of a delay circuit, and generating the digital buffer and the delay circuit according to the delay parameters. The delay signal setting module is used for a delay signal setting module for setting a delay interval for the transition from a high voltage to a low voltage and a delay interval for the transition from a low voltage to a high voltage of an input delay signal. The voltage regulation circuit defining module is used for defining voltage parameters of a voltage regulation circuit, and generating the voltage amplifier and the voltage regulation circuit according to the voltage parameters. The voltage regulating module is used for regulating a voltage of the input delay signal from the delay circuit according to requirements of an output delay signal. The model calling module is used for generating a delay emulation model by means of calling the delay circuit and the voltage regulation circuit.

Another preferred embodiment provides a method for designing a delayer emulation model by utilizing the above system. The method includes the steps: (a) generating a delayer circuit; (b) generating a digital buffer; (c) generating a voltage regulation circuit; (d) defining a voltage amplifier; (e) setting a delay interval for the transition from a high voltage to a low voltage or a delay interval for the transition from a low voltage to a high voltage of an input delay signal; (f) regulating (amplifying/falling) a voltage of the input delay signal according to the requirements of the output delay signal; and (g) generating the delay emulation model by means of calling the delay circuit and the voltage regulation circuit.

In summary, the system and method can generate a delayer emulation model which can set delay intervals of an input delay signal according to delay requirements, and regulate a voltage of the input delay signal.

Other advantages and novel features of the embodiments will be drawn from the following detailed description with reference to the attached drawings, in which:

DETAILED DESCRIPTION OF THE EMBODIMENTS

In the following description of the preferred embodiment of the present invention, a delayer emulation model is produced by means of utilizing a compiled language editor named "PSpice model editor" of a simulation software, which is named "Cadence OrCAD Pspice."

Figure 1:
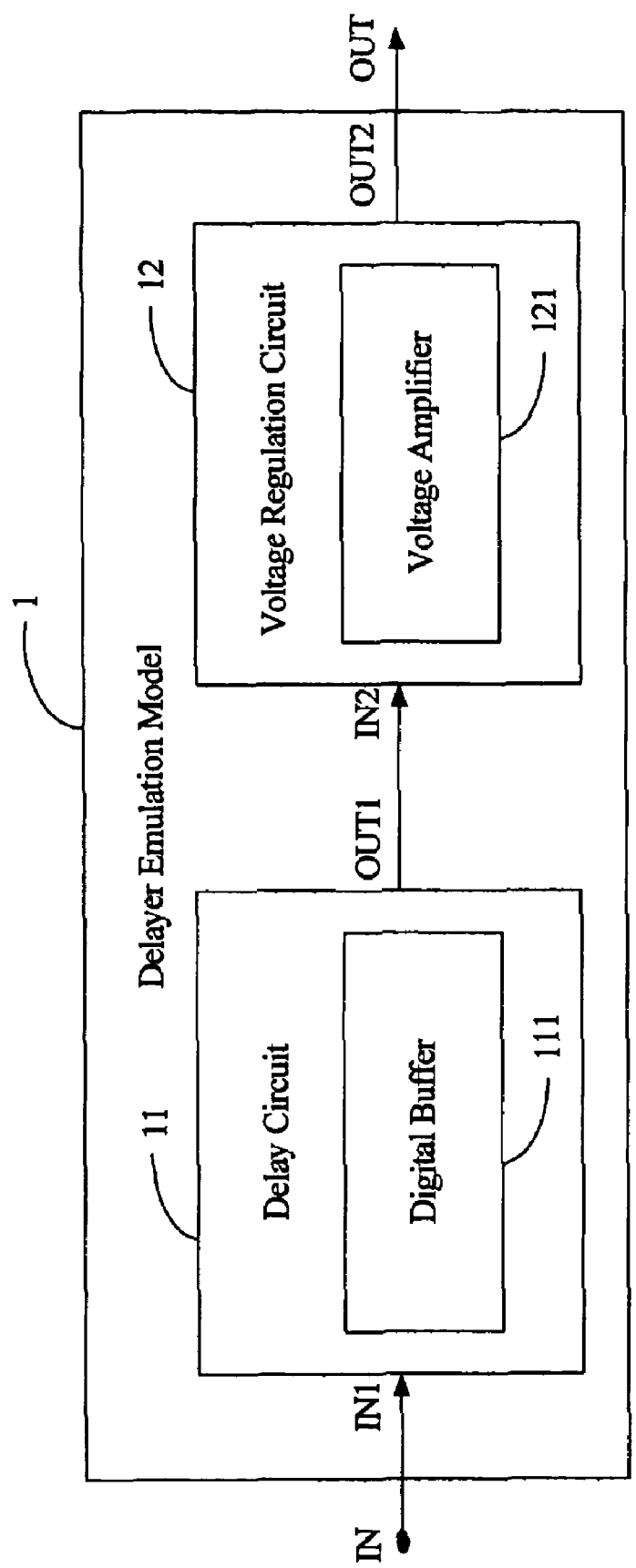
FIG. 1 is a schematic diagram of a delayer emulation model according to a preferred embodiment of the present invention.

FIG. 1 is a schematic diagram of a delayer emulation model for a delay circuit according to a preferred embodiment of the present invention. The delayer emulation model 1 includes a delay circuit 11 and a voltage regulation circuit 12, and has an input port (symbolically depicted as IN) and an output port (symbolically depicted as OUT). The port IN may be connected to a signal source instrument (not shown) for inputting a delay signal. The port OUT is used for outputting a delay signal, and may be connected to a signal output instrument (not shown). The delay circuit 11 includes a digital buffer 111, and has an input port (symbolically depicted as IN1) and an output port (symbolically depicted as OUT1). The digital buffer 111 is used for setting delay intervals of the delay signal according to delay requirements. The voltage regulation circuit 12 includes a voltage amplifier 121, and has an input port (symbolically depicted as IN2) and an output port (symbolically depicted as OUT2). The voltage amplifier 121 is used for regulating (amplifying/falling) voltage of the delay signal from the delay circuit 11. According to the delay emulation model 1 described above, a delay signal is input from the port IN, and a required delay signal is output from the port OUT.

Figure 2:
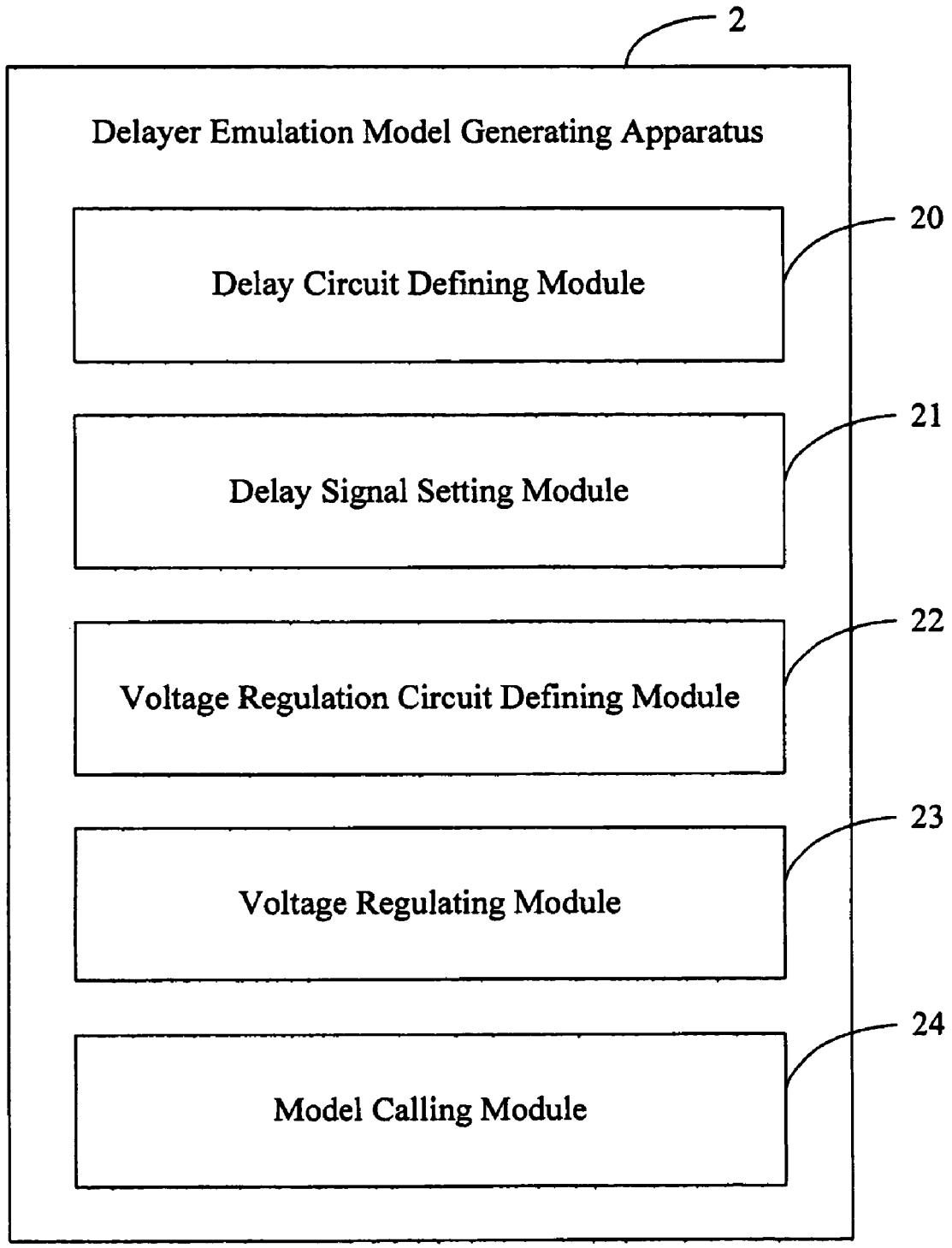
FIG. 2 is a diagram of function modules of a delayer emulation model generating apparatus.

FIG. 2 is a schematic diagram of function modules of a delayer emulation model generating apparatus 2. The delayer emulation model generating apparatus 2 includes a delay circuit defining module 20, a delay signal setting module 21, a voltage regulation circuit defining module 22, a voltage regulating module 23, and a model calling module 24. The delay circuit defining module 20 is used for defining delay parameters of a delay circuit 11, and generating a digital buffer 111 and the delay circuit 11 according to the delay parameters. The delay signal setting module 21 is used for setting a delay interval for the transition from a high voltage to a low voltage and a delay interval for the transition from a low voltage to a high voltage of an input delay signal. The voltage regulation circuit defining module 22 is used for defining voltage parameters of a voltage regulation circuit 12, and generating a voltage amplifier 121 and the voltage regulation circuit 12 according to the voltage parameters. The voltage regulating module 23 is used for regulating (amplifying/falling) voltage of the input delay signal from the delay circuit 11 according to requirements of the output delay signal. The model calling module 24 is used for generating a delayer emulation model 1 by means of calling the delay circuit 11 and the voltage regulation circuit 12.

Figure 3:
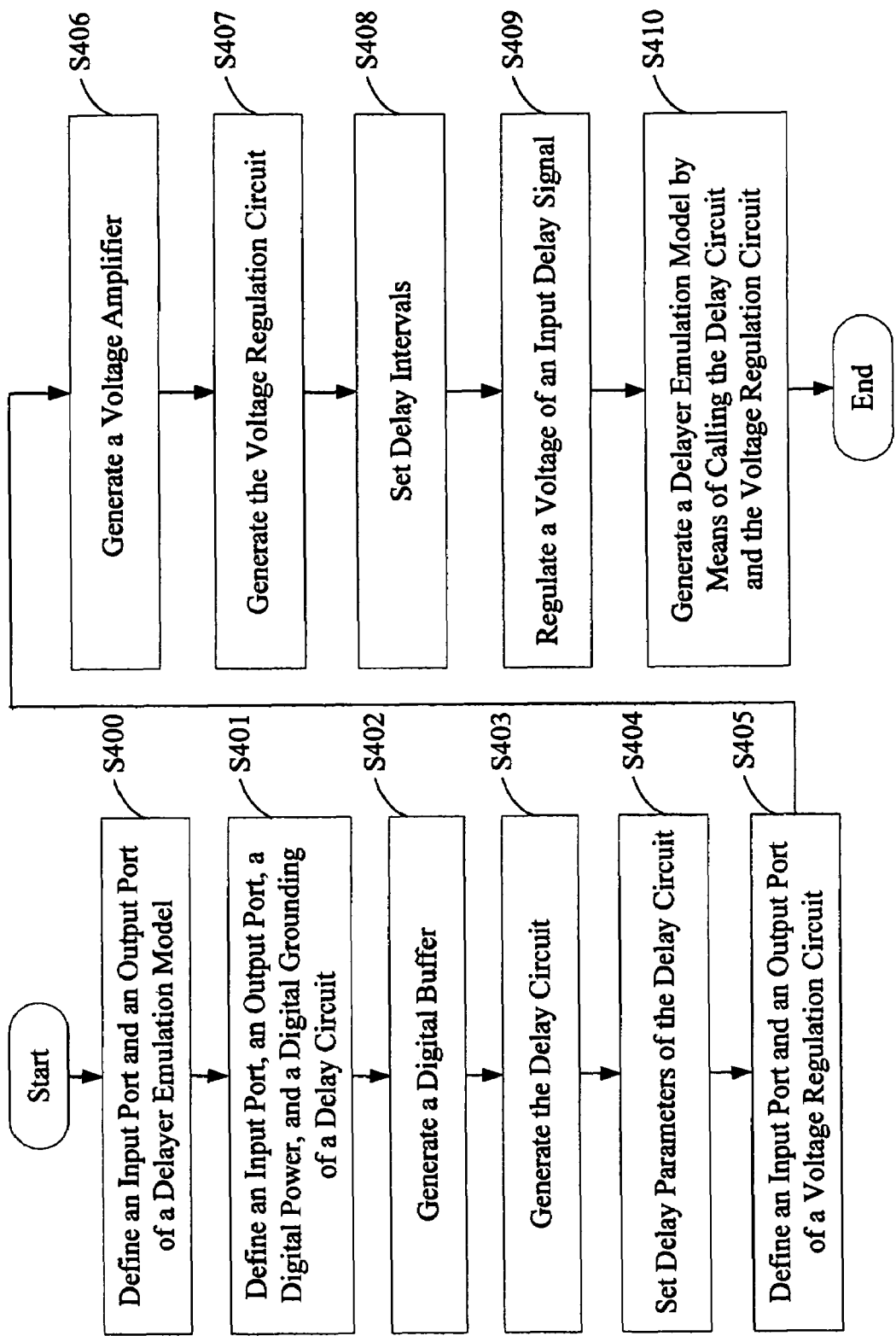
FIG. 3 is a flowchart of a preferred method for designing a delayer emulation model by implementing the delayer emulation model generating apparatus of FIG. 2.

FIG. 3 is a flowchart of a preferred method for designing a delayer emulation model 1 by implementing the delayer emulation model generating apparatus 2. In step S400, the delayer emulation model generating apparatus 2 initializes I/O ports of the delayer emulation model 1, such as defining an input port as IN and an output port as OUT. In step S401, the delay circuit defining module 20 initializes I/O ports of a delay circuit 11, such as defining an input port as IN1 and an output port as OUT1, and defines a digital power as DPWR and a digital grounding as DGND of the delay circuit 11. In step S402, the delay circuit defining module 20 generating a digital buffer 111. Then, in step S403, the delay circuit defining module 20 generates the delay circuit 11. In step S404, the delay signal setting module 21 sets delay parameters of the delay circuit 11 as defaults, such as setting a delay interval as a standard delay interval and each I/O port as a standard I/O port. In step S405, the voltage regulation circuit defining module 22 initializes I/O ports of a voltage regulation circuit 12, such as defining an input port as IN2, and an output port as OUT2 of the voltage regulation circuit 12. In step S406, the voltage regulation circuit defining module 22 generates a voltage amplifier 121. Then, in step S407, the voltage regulation circuit defining module 22 generates a voltage regulation circuit 12. In step S408, the delay signal setting module 21 sets a delay interval for the transition from a high voltage to a low voltage and a delay interval for the transition from a low voltage to a high voltage of an input delay signal by means of utilizing the digital buffer 111, and outputs a required output delay signal. In step S409, the voltage regulating module 23 regulates a voltage of the input delay signal from the delay circuit 11 to a voltage of the output delay signal by means of utilizing the voltage amplifier 121. In step S410, the model calling module 24 generates the delayer emulation model 1 by means of calling the delay circuit 11 and the voltage regulation circuit 12 described above.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for designing a delayer emulation model, the system comprising a delayer emulation model generating apparatus, the delayer emulation model generating apparatus comprising:
   a delay circuit defining module for defining delay parameters of a delay circuit of the delayer emulation model, and generating the delay circuit according to the delay parameters, wherein the delay circuit comprises a digital buffer for setting delay intervals of an input delay signal;
   a voltage regulation circuit defining module for defining voltage parameters of a voltage regulation circuit, and generating the voltage regulation circuit according to the voltage parameters; and
   a model calling module for generating the delayer emulation model by calling the delay circuit and the voltage regulation circuit.

2. The system according to claim 1, wherein the delayer emulation model generating apparatus further comprises a delay signal setting module for setting the delay intervals such that a first one of the delay intervals is for the transition from a high voltage to a low voltage and a second delay interval is for the transition from a low voltage to a high voltage of the input delay signal.

3. The system according to claim 1, wherein the delayer emulation model generating apparatus further comprises a voltage regulating module for regulating a voltage of the input delay signal from the delay circuit according to requirements of an output delay signal.

4. The system according to claim 3, wherein the voltage regulation circuit comprises a voltage amplifier for regulating a voltage of the input delay signal from the delay circuit.

5. A computerized method for designing a delayer emulation model, the method comprising the steps of:
   generating a delay circuit;
   generating a voltage regulation circuit;
   generating a digital buffer for setting delay intervals of an input delay signal;
   setting the delay intervals of the input delay signal according to requirements of an output delay signal;
   regulating a voltage of the input delay signal according to the requirements of the output delay signal; and
   generating the delay emulation model by means of calling the delay circuit model and the voltage regulation circuit model.

6. The method according to claim 5, further comprising the step of:
   initializing I/O ports of the delayer emulation model by means of defining an input port and an output port of the delay emulation model.

7. The method according to claim 5 wherein the step of setting the delay intervals comprises the step of:
   setting a delay interval for the transition from a high voltage to a low voltage of the input delay signal; or
   setting a delay interval for the transition from a low voltage to a high voltage of the input delay signal.

8. The method according to claim 5, further comprising the step of:
   generating a voltage amplifier for regulating the voltage of the input delay signal.

9. The method according to claim 8, wherein the step of regulating the voltage of the input delay signal comprises the step of:
   amplifying the voltage of the input delay signal; or
   reducing the voltage of the input delay signal.

10. A method for creating a delayer emulation model to simulate a delay circuit, the method comprising the steps of:
    generating a delay circuit part of a delayer emulation model;
    generating a voltage regulation circuit part of said delayer emulation model capable of accepting signals from said delay circuit part;
    establishing ability to set delay intervals of input delay signals for said delayer emulation model by means of said delay circuit part according to an output requirement of said delayer emulation model, wherein said delay intervals of said input delay signals are set by a digital buffer of said generated delay circuit part; and
    establishing ability to regulate said signals from said delay circuit part by means of said voltage regulation circuit part.

* * * * *